United States Patent
Usach Merino et al.

(10) Patent No.: US 11,256,652 B2
(45) Date of Patent: Feb. 22, 2022

(54) MULTI-I/O SERIAL PERIPHERAL INTERFACE FOR PRECISION CONVERTERS

(71) Applicant: Analog Devices International Unlimited Company, Limerick (IE)

(72) Inventors: Miguel Usach Merino, Valencia (ES); Wes Vernon Lofamia, Gen. Trias (PH); Fergus John Downey, Oranmore (IE); David A. Browne, Limerick (IE); Thomas Murphy, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/879,205

(22) Filed: May 20, 2020

(65) Prior Publication Data
US 2020/0401549 A1 Dec. 24, 2020

Related U.S. Application Data

(60) Provisional application No. 62/864,286, filed on Jun. 20, 2019.

(51) Int. Cl.
*G06F 13/42* (2006.01)
*G06F 13/16* (2006.01)
(Continued)

(52) U.S. Cl.
CPC ...... *G06F 13/4282* (2013.01); *G06F 9/30101* (2013.01); *G06F 9/30189* (2013.01);
(Continued)

(58) Field of Classification Search
None
See application file for complete search history.

(56) References Cited

U.S. PATENT DOCUMENTS

| 7,533,106 B2 * | 5/2009 | Magdeburger ........ G06F 13/385 |
| 2004/0008725 A1 * | 1/2004 | McNamara ......... G06F 13/4291 370/466 |

(Continued)

FOREIGN PATENT DOCUMENTS

| CN | 103544991 A | * 1/2014 |
| CN | 109030926 A | * 12/2018 |

(Continued)

OTHER PUBLICATIONS

'ADS1118 Ultrasmall, Low-Power, SPI-Compatible, 16-Bit Analog-to-Digital Converter with Internal Reference and Temperature Sensor' SBAS457F, by Texas Instruments, Revision F Oct. 2015. (Year: 2015).*

(Continued)

*Primary Examiner* — Steven G Snyder
(74) *Attorney, Agent, or Firm* — Schwegman Lundberg & Woessner, P.A.

(57) ABSTRACT

A Multi-I/O SPI for precision converters supports a Dual/Quad/Octal SPI to support the speed requirements for digital transmission and also includes a special mode that can be enabled by hardware and/or software to remove the bit scrambling requirement dictated by the JEDEC standard. The special mode removes the scramble requirement and associates each of the bidirectional data lines to a specific channel. The special mode provides backward compatibility that permits the precision converter to be used with controllers that do not natively support the JEDEC standard. Also, the Multi-I/O SPI includes registers divided into a primary region that is accessed only in default mode at power-up for write and/or read operations, and a secondary region that is accessed by any mode enabled in the control register. By restricting access to the "control" register area to a pre- (Continued)

defined mode in the converter at power-up, the access mode can be controlled.

21 Claims, 6 Drawing Sheets

(51) Int. Cl.
    *G06F 12/0882*     (2016.01)
    *G06F 11/07*       (2006.01)
    *G06F 9/30*        (2018.01)
    *G11C 7/20*        (2006.01)
    *G11C 7/10*        (2006.01)

(52) U.S. Cl.
    CPC ...... *G06F 11/0772* (2013.01); *G06F 12/0882* (2013.01); *G06F 13/1605* (2013.01); *G11C 7/1075* (2013.01); *G11C 7/20* (2013.01)

(56) References Cited

U.S. PATENT DOCUMENTS

2005/0228980 A1* 10/2005 Brokish .................. G06F 21/74
                                                                                   713/2
2007/0061342 A1* 3/2007 Magdeburger ........ G06F 13/385
2014/0101349 A1* 4/2014 Engl .................. G06F 13/4072
                                                                                    710/104

FOREIGN PATENT DOCUMENTS

CN            112115083       12/2020
KR      20080049099 A  *  6/2008  ........... G06F 13/385

OTHER PUBLICATIONS

'16-Bit, 2 MSPS/1 MSPS, Precision, Differential SAR ADCs—AD4001/AD4005' by Analog Devices, 2017. (Year: 2017).*
Designing with Cypress Quad SPI (QSPI) F-RAM from Cypress, 2017. (Year: 2017).*
'Enhanced Serial Peripheral Interface (eSPI)—Interface Base Specification (for Client and Server Platforms)' Revision 0.75, Jun. 2013, Intel. (Year: 2013).*
'OctaFlash' from Macronix, archived on Apr. 21, 2019. (Year: 2019).*
'Enabling Faster, Smarter, and More Robust System Solutions for SAR ADCs With TI's multiSPI Digital Interface' White Paper SBAY002, 2016, Texas Instruments. (Year: 2016).*
'Octal Serial Peripheral Interface VIP' from SmartDV Technologies, archived Feb. 18, 2019. (Year: 2019).*
'Serial Peripheral Interface (SPI) User Guide' SPRUGP2A, from Texas Instruments, Mar. 2012. (Year: 2012).*
'64M-BIT Serial Flash Memory With Dual and Quad SPI' from Winbond, 2010. (Year: 2010).*

* cited by examiner

MULTI-I/O SERIAL PERIPHERAL INTERFACE FOR PRECISION CONVERTERS

CLAIM OF PRIORITY

This application claims priority to U.S. Provisional Application No. 62/864,286, filed Jun. 20, 2019, which is incorporated herein by reference in its entirety.

FIELD OF THE DISCLOSURE

This document relates to precision converters and, in particular, to a Multi-I/O serial peripheral interface (SPI) for precision converters.

BACKGROUND

JEDEC (jedec.org) has developed a few serial communication standards for memories like Flash and/or SDCards. These standards were created to guarantee a common communication protocol independently of the memory manufacture and/or size so that any controller may communicate with memories in the same way.

The flash memory JEDEC standards provide different data link layers of communication and, as in other standards like Ethernet, the memories must support a basic mode. The flash memory JEDEC standards also provide minimum overhead, enough bandwidth for actual and future needs, and the data link layer is widely supported by most FPGAs through IP blocks, as well as the latest microcontrollers and digital signal processors. The flash memory JEDEC standards support data transmission by using more than one data line and define bidirectional data lines. By transferring specific commands or setting specific registers, the communication speed may increase for devices configured under the flash memory JEDEC standard.

SUMMARY OF THE DISCLOSURE

This document relates to precision converters and, in particular, to a Multi-I/O serial peripheral interface (SPI) for precision converters.

The Multi-I/O SPI for precision converters described herein supports a Dual/Quad/Octal SPI to support the speed requirements for digital transmission. The Multi-I/O SPI for precision converters also includes a mode that can be enabled by hardware and/or software to remove the bit scrambling requirement dictated by the flash memory JEDEC standard ("JEDEC standard") so that the precision converter may have backward compatibility that permits the precision converter to also be used with controllers that do not support the JEDEC standard without requiring software data manipulation that penalizes controller speed. The special mode removes the scramble requirement and associates each of the bidirectional data lines to a specific channel. The special mode also enables the Multi-I/O SPI device to efficiently work with devices that do not natively support the JEDEC standard.

Also, the Multi-I/O SPI for precision converters described herein includes registers divided into two regions. The primary region is accessed only in default mode defined at power-up for write and/or read operations. The secondary region is accessed by any SPI mode enabled in the control register. In sample embodiments, the default power-up can be changed by adding an external pin to the slave/converter to define the interface mode at power-up or by using an internal fuse or switch. By restricting access to the "control" register area to a pre-defined mode in the converter at power-up, the access mode can be controlled to avoid miscommunications.

In some aspects, a Multi-I/O serial peripheral interface (SPI) in sample embodiments includes a controller having at least two SPI blocks having internally synchronized clock signals, each SPI block transferring data simultaneously, and a slave device that transfers data to/from each SPI block of the controller via respective data lines. A mode selector is provided that is adapted to select a first mode for transferring data between the slave device and each SPI block of the controller in a bits scrambling format dictated by a memory transfer standard or a second mode for transferring data between the slave device and each SPI block of the controller without the bits scrambling format dictated by the memory transfer standard whereby each data line is associated with a data channel. In sample embodiments, the memory transfer standard is a JEDEC flash memory communication standard. During operation, when more than one data line is enabled to read and/or write data to the slave device from the controller, the first mode is selected by the mode selector and each data line is adapted for bidirectional communication to the data channel. In the sample embodiments, at least one bidirectional multiplexer may be situated in the respective data lines and the mode selector comprises a pin that provides a mode selection signal to the at least one bi-directional multiplexer. Alternatively, the mode selector may comprise a data select pin on the slave device that provides a mode selection signal to the respective data lines. The mode selector may select the second mode when a device being communicated with via the Multi-I/O SPI is not a JEDEC standard device by changing a state of the select pin on the slave device.

In some other aspects, a Multi-I/O serial peripheral interface (SPI) in sample embodiments includes a slave comprising registers divided into a primary region and a secondary region, the primary region including data for configuring the slave and data about errors, and the secondary region including data for providing digital to analog converter (DAC) operation and/or analog to digital converter (ADC) operation. A controller device transfers data to/from the slave via respective data lines, and a mode selector is adapted to select a default mode at power-up. The primary region can only be accessed in the default mode at power-up for write and/or read operations, and the secondary region can be accessed by any mode enabled by the primary region. In sample embodiments, the primary region contains at least one register that stores data supporting interface configuration, data supporting errors, data supporting power modes, data for configuring the slave, data for describing slave behaviour, and/or data for providing error checks and status, while the secondary region contains at least one register that controls the input/output data, DAC operation and/or ADC operation, and/or stores a page mask. The primary region may also contain data identifying a voltage span range of the DAC operation or the ADC operation.

In sample embodiments, the slave device may comprise at least one internal fuse or at least one switch adapted to provide a power-up mode select function that defines an interface mode at power-up of the slave device. Also, the mode selector may comprise a mode selection pin on the slave device that is adapted to provide a power-up mode select function that defines an interface mode at power-up of the slave device. The mode selection pin on the slave device may be connected to a first voltage to set the controller and slave device in a first default mode at power up in which the SPI is configured for accessing the primary region and later reconfiguring the secondary region. An error pin also may connect the slave device to the controller. In the first default mode, the slave device may trigger the error pin and pull error registers of the primary region after the slave device has been initialized. Also, the mode selection pin on the slave device may be connected to a second voltage to set the controller and slave device in a second default mode at power up in which the controller reconfigures the SPI in a dual, quad, or octal SPI mode to access the primary region and the secondary region using two, four, or eight data lines, respectively.

In other aspects, the methods performed by the Multi-/O SPIs described herein are also described. Such methods may include, for example, a method for controlling a Multi-I/O serial peripheral interface (SPI)) comprising providing a controller having at least two SPI blocks having internally synchronized clock signals, each SPI block transferring data simultaneously, and selecting a first mode or a second mode for transferring data between the controller and a slave device that transfers data to/from each SPI block of the controller via respective data lines. Data can be transferred in the first mode by each SPI block of the controller in a bits scrambling format dictated by a memory transfer standard and can be transferred in the second mode by each SPI block of the controller without the bits scrambling format dictated by the memory transfer standard whereby each data line is associated with a data channel.

The disclosed methods may also include a method for powering up a Multi-I/O serial peripheral interface (SPI)) comprising providing a controller having registers divided into a primary region and a secondary region, the primary region including data for configuring the controller and data about errors, and the secondary region including data for providing at least one of a digital to analog converter (DAC) operation or an analog to digital converter (ADC) operation. A default mode is selected at power-up in which the primary region is accessed in the default mode only for write and/or read operations and the secondary region is accessed by any mode enabled by the primary region.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description with respect to FIGS. 1-9 sufficiently illustrates specific embodiments to enable those skilled in the art to practice them. Other embodiments may incorporate structural, logical, process, and other changes. Portions and features of some embodiments may be included in, or substituted for, those of other embodiments. Embodiments set forth in the claims encompass all available equivalents of those claims. The example embodiments are presented for illustrative purposes only and are not intended to be restrictive or limiting on the scope of the disclosure or the claims presented herein.

Figure 1:
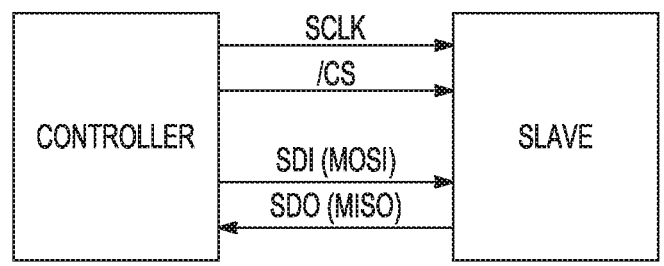
FIG. 1 illustrates the direction of each data line in Classic/Single SPI between a controller and an SPI slave chip.

The data link layer for JEDEC flash memory communication in JESD216D.01 is known as Multi-I/O SPI. Multi-I/O SPI provides two main transmission modes:

Classic/Single SPI: In this mode there are 4 unidirectional data lines, /CS, SCLK, MOSI (or SDI), and MISO (or SDO). FIG. 1 illustrates the direction of each data line in Classic/Single SPI between a controller and a SPI slave chip.

Figure 2:
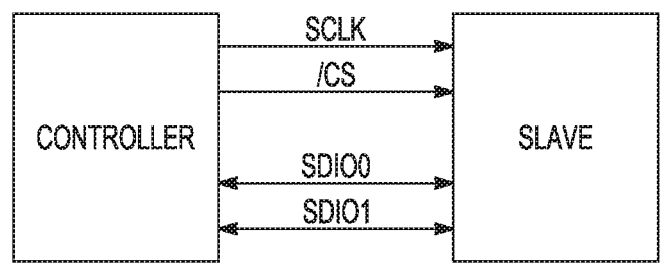
FIG. 2 illustrates the direction of each data line in Dual SPI between a controller and an SPI slave chip.

Dual/Quad/Octal SPI: In this mode, there are two unidirectional data lines, /CS, and SCLK, and 2/4/8 bidirectional data lines, from SDIO0 up to SDIO7, depending on the mode supported by the controller and slave. FIG. 2 illustrates the direction of each data line in Dual SPI between a controller and an SPI slave chip for two bidirectional data lines SDIO0 and SDIO1.

Figure 3:
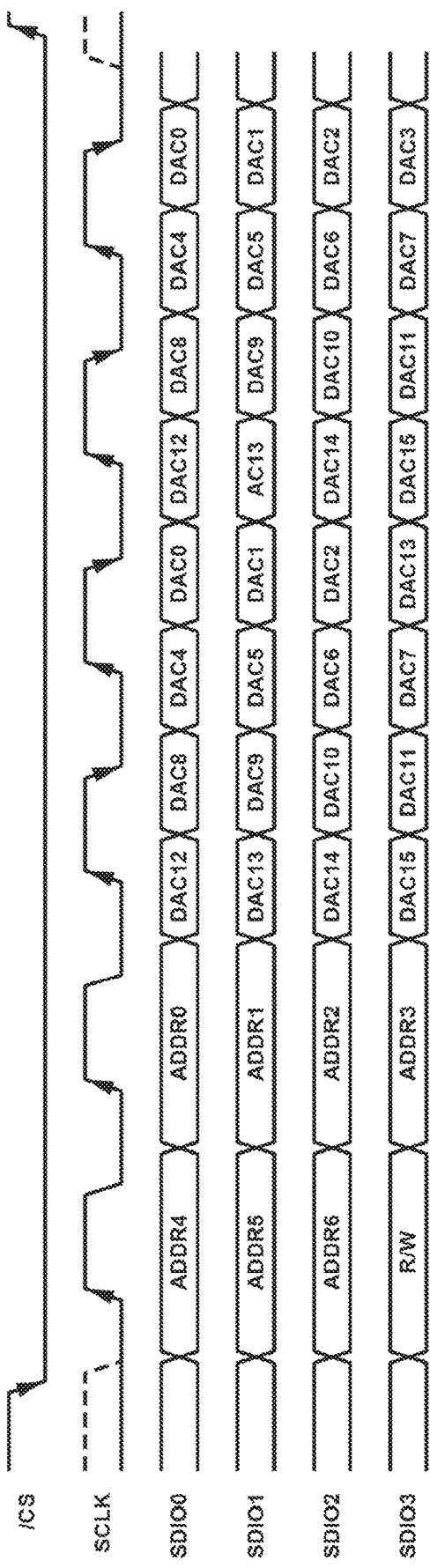
FIG. 3 illustrates the case of full Quad SPI with DDR (dual data rate) enable, where the bits transferred must be scrambled when more than one data line is used to transfer the data.

From the precision converter perspective, it is desirable to increase analog bandwidth, which requires an interface capable of supporting the interface bitrate. However, in the case of Dual/Quad/Octal SPI, the JEDEC standard dictates that when more than one data line is available to transfer the data, the bits transferred must be scrambled. As illustrated in FIG. 3, the bits are scrambled by alternating among the SDIO0, SDIO1, SDIO2, and SDIO3 data lines from the MSB to the LSB in the Quad transfer mode. If the controller provides hardware support for the Multi-I/O interface, the bits scramble may be done at the hardware level. However, when no specific hardware is available for the bits scramble, as is the case with devices that do not natively support the JEDEC standard, the scrambling must be done in software prior to transmission, which significantly penalizes the controller's performance. This makes it difficult for Multi-I/O standard precision controllers to communicate with other devices that do not natively support the JEDEC standard.

Also, the Multi-I/O SPI standard defines the "meaning" of the bytes transferred through the interface as "phases." The Multi-I/O SPI standard defines 3 phases:

Command—defines the action to be perform on the memory: read or write;
Address—start of the memory address to perform the action; and
Data—data that is transferred to the SPI slave device.

In sample embodiments, the command address phases may be combined into a single phase, as noted below. Each phase has its own properties including the number of data lines used to transfer the bytes and the bytes that will be transferred in dual data rate (DDR)(data) lines are sampled in both clock edges) or single data rate (SDR)(only one clock edge is used to transfer the data). By default, the combined command/address phase has fixed properties, and the command and address used dictates/defines the properties of subsequent phases based on registers, fuses, or switches. For example, the JEDEC standard has few commands for readback, but one command defines that the combined command/address phase will be transferred using two data lines in SDR, while other commands define 4 data lines and DDR.

The properties in the combined command/address phase, like using more than one data line in following phases, can be enabled by issuing a special command which sets an internal register for the JEDEC standard. In Multi-I/O, the command is a register write. After the special command is transferred, all the subsequent communication will be done using this mode, until another special command is transferred to disable this mode. Then, the device expects the command phase in default serial peripheral interface (SPI) communication mode. However, if the power to the precision converter is temporarily lost, the precision converter will reset. This is a problem in the case of analog domain failure as the precision converter will reset to the default SPI communication mode and not the special command mode, thus creating the potential for communications errors.

For clarity, there are two inputs in the Multi-/O SPI standard:

The mode: Multi-I/O SPI basic mode (1S-1S-1S) (means the number of data lines used for command-address-data and denotes single or dual data rate) is the "classic" SPI (SCLK, /CS, MISO and MOSI). Other modes are a hybrid between parallel and serial interface, like (1-2-2), that is, the data is transmitted in a serial fashion using parallel lines. A special mode will be (2-2-2) as the command must be transmitted using 2 data lines, but the memory must know in advance.

Enabling/Disabling of each phase: The controller's hardware is agnostic in terms of what the SPI slave device is expecting, and it is up to the user to enable/disable each phase individually, providing huge flexibility in terms of number of data lines used per phase, bytes transferred per phase, or the use of DDR.

It is desired to provide a Multi-I/O SPI that enables JEDEC standard precision converters to support at least two or more power domains. It is also desired to provide a special mode that removes the scramble requirement that associates each of the bidirectional data lines of JEDEC standard precision converters to a specific channel so that the precision controller may work effectively with circuitry that does not natively support the JEDEC standard.

Synchronous Multi-I/O SPI Mode

If the controller of a precision converter does not support natively the JEDEC standard for dual, quad, and octal SPI modes, that is, provide a hardware Multi-I/O implementation within the peripheral's blocks, the controller still could benefit from the speed that this interface could achieve by synchronizing internally two or more classic serial peripheral interface (SPI) hardware blocks. Some controllers may synchronize multiple hardware interfaces so they can emulate Multi-I/O SPI standards. In this mode of operation, the hardware itself does not support bits scramble so the bit manipulation is done at the software level.

Figure 4:
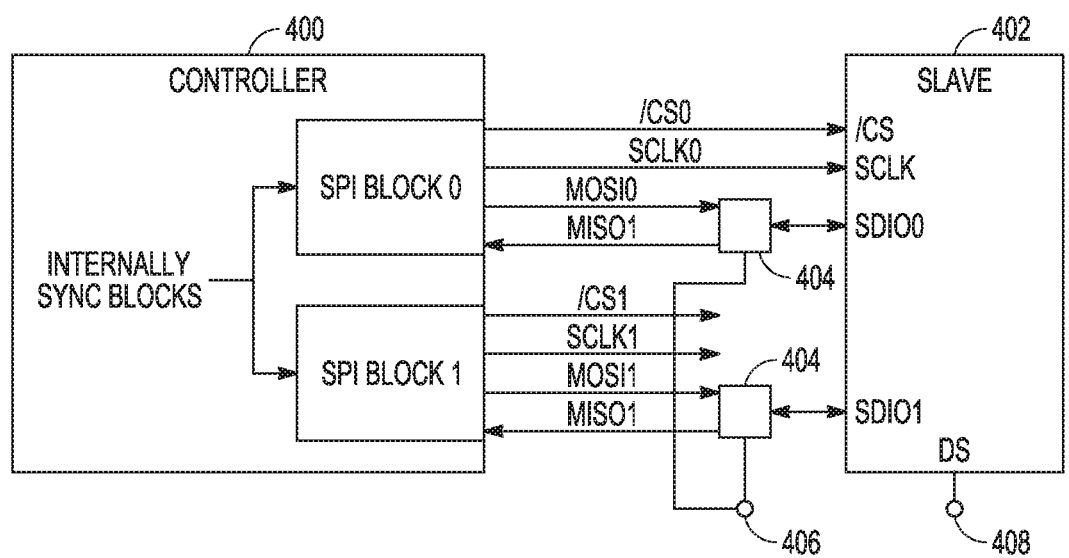
FIG. 4 illustrates internally synchronized SPI block 0 and an SPI block 1 and physical pin connection of a controller for parallel data transfer.

For example, FIG. 4 illustrates internally synchronized SPI block 0 and an SPI block 1 of a controller 400. Each block communicates with a slave unit 402 using the synchronized clock signals /CS0 and SCLK0 as illustrated. Each SPI block transfers the data simultaneously. However, the data lines MOSI0 and MISO0 (and MOSI1 and MISO1) from the respective SPI blocks are multiplexed by an optional bidirectional multiplexer 404 that routes the signal from SDIOx to MOSIx or MISOx depending on whether the data phase is read or write. The multiplexers 404 may be controlled to route the data to the appropriate pin. By enabling this mode, the precision converter does not expect scrambled data as required by the JEDEC standard. As a result, the positions of the bits must be changed to match the JEDEC standard. In many cases, this scrambling is performed in software, which is slow and impractical.

Thus, the main restriction for data transfer is the data scrambling dictated by the JEDEC standard. In other words, before transferring the bytes to the SPI blocks, the positions of the bits must be changed to match the Multi-I/O SPI standard. As an example, assume that the user would like to transfer two bytes of data using two data lines. If the two bytes of data will be directly transferred using the two SPI blocks, the bytes will be transferred as:

| MOSI0 | B0-MSB | B0-MSB−1 | ... | B0- LSB+1 | B0- LSB |
| MOSI1 | B1-MSB | B1-MSB−1 | ... | B1- LSB+1 | B1- LSB | where B0 and B1 defines byte 0 and byte 1 to be transferred. However, under the Multi-I/O SPI standard, the slave device 402 expects the bytes in the following format:

| SDIO0 | B1-MSB−1 | ... | B1-LSB | ... | B0- MSB−1 | ... | B0- LSB |
| SDIO1 | B1-MSB | ... | B1-LSB + 1 | ... | B1- MSB | ... | B1- LSB+1 |

To overcome this problem, the controller 400 controls bidirectional multiplexer 404 to route the bits for transfer in the synchronous SPI mode as follows:

| Byte0 | B1-MSB−1 | ... | B1-LSB | ... | B0- MSB−1 | ... | B0- LSB |
| Byte1 | B1-MSB | ... | B1-LSB+1 | ... | B0- MSB | ... | B0- LSB+1 |

However, this manipulation is computationally expensive, especially for a large amount of data, and real time applications which could make the bit manipulation impractical.

To address this issue, the Multi-I/O SPI is modified in sample embodiments to provide a special mode that can be enabled by hardware and/or software to remove the bit scrambling dictated by the JEDEC standard. When more than one data line is enabled to read and/or write data to the slave, a special mode is enabled that removes the bit scrambling requirement and associates each of the bidirectional data lines to a specific channel. Thus, when the device being communicated with is not a JEDEC standard device, the bit scrambling is turned off by switching the Multi-I/O SPI into a "synchronous Multi-I/O SPI" mode. For example, the bidirectional multiplexer 404 may be switched into the "synchronous Multi-I/O SPI" mode by changing a state (e.g., changing applied voltage) of a controller pin 406 or data select (DS) pin 408 applied to the slave 402 as illustrated in FIG. 4. More details about the DS functionality may be found in the JESD216D standards documentation and is not included herein.

Figure 5:
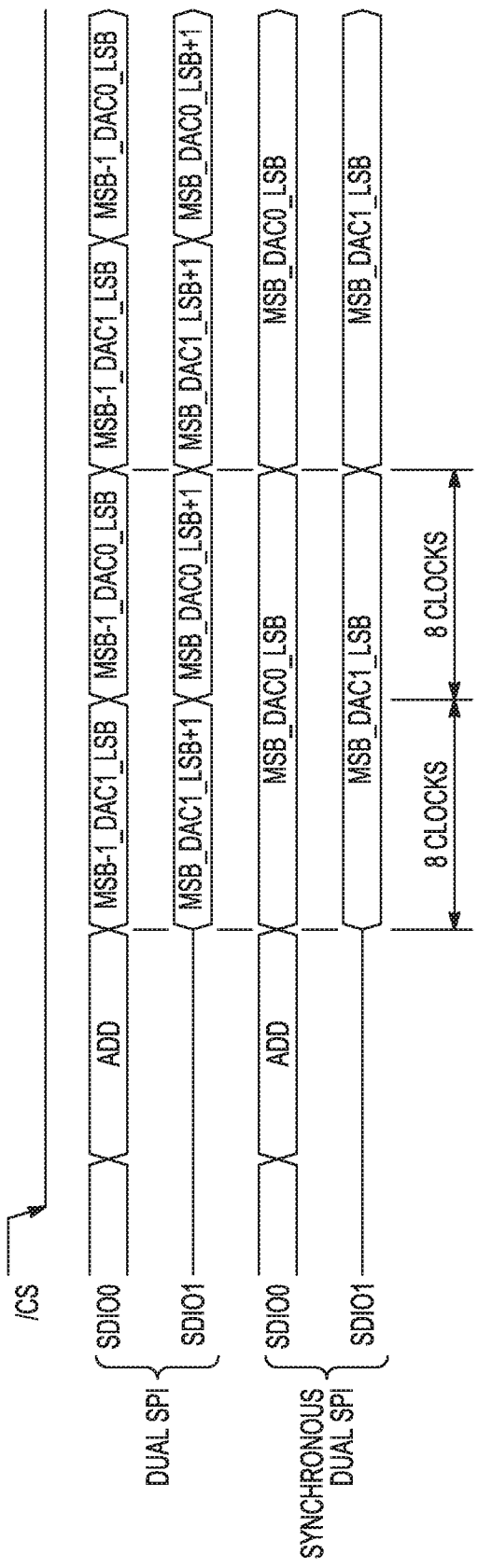
FIG. 5 illustrates the transmission difference between synchronous Dual SPI as in FIG. 4 and a Dual SPI implementation as described herein.

The synchronous Multi-I/O SPI mode allows controllers that do not support the JEDEC standard to use the Multi-I/O converters when the Multi-I/O converters are placed in the synchronous Multi-I/O SPI mode. As noted above, in this mode, the device does not expect the data to be scrambled when more than one data line is enabled. In this case, each SDIO pin is linked to a converter channel. FIG. 5 illustrates the transmission difference between Dual SPI as in FIG. 4 and a synchronous Dual SPI implementation as described herein.

The Table below summarizes the difference between how the sampled bits are interpreted by the slave 402 in Dual SPI for the Multi-I/O mode and the "synchronous Multi-I/O SPI" mode.

| Multi-I/O | SDIO0 | B1-MSB−1 | ... | | B1-LSB | ... | B0- MSB−1 |
|---|---|---|---|---|---|---|---|
| | SDIO1 | B1- MSB | ... | | B1-LSB+1 | ... | B0- MSB |
| Sync | SDIO0 | B0-MSB | B0-MSB−1 | ... | | B0- LSB+1 | B0- LSB |
| Multi-I/O | SDIO1 | B1- MSB | B1-MSB−1 | ... | | B1- LSB+1 | B1- LSB |

In sample embodiments, the Multi-I/O SPI is provided with a special mode to remove the scramble requirement by simply selecting an external pin of the controller or by using internal fuses or registers that change the switching mode of the controller. Each of the bidirectional data lines is associated with a specific channel as shown in the Table above according to the selected mode. It will be appreciated that in the "synchronous Multi-I/O SPI" mode, the device does not expect the data to be scrambled when more than one data line has been enabled. Each SDIO pin is linked to a converter channel, and the data is outputted as indicated in the Table for the respective modes.

Default Power-Up Mode

Multi-I/O SPIs for precision converters have a few basic requirements. First, there should be minimum overhead when data is transmitted through the Multi-I/O SPI in order to reduce the digital feedthrough and driver requirements as well as to increase communication (data) speed for a given clock. Second, the Multi-I/O SPI should support multiple data link layers to support and to adapt to user requirements and limitations. For instance, a user may prefer higher clock rates using less data lines or, alternatively, may prefer more data lines and lower clock rates.

Figure 6:
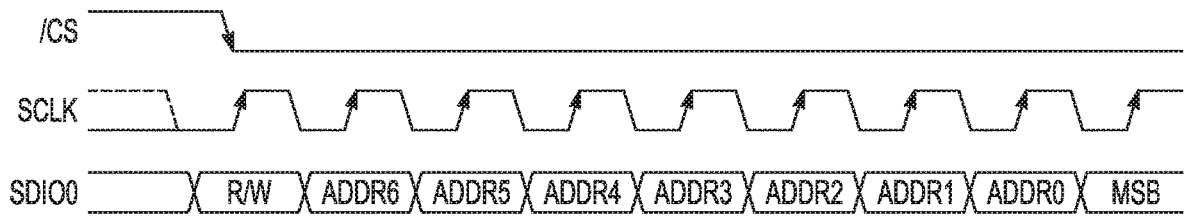
FIG. 6 illustrates that the preamble for address transmission may be a byte indicating whether the following data is read or write data in a sample embodiment.

As the JEDEC standard is applied to controller hardware and defines the minimum length for the command phase as a byte, the data to be transferred may need to be tinkered with to improve interface efficiency. Also, since the controller Multi-I/O SPI hardware implementation can disable individually each phase, in a precision converter it may become desirable to merge command and address phases to reduce the preamble to a single byte so that the MSB may dictate the direction of the data phase. In such a case, an extra command and/or address phase is not needed. Instead, as illustrated in FIG. 6, the preamble simply may be a bit indicating whether the following data is read or write data, thereby saving at least 8 extra clocks.

Another issue with the JEDEC standard is that the standard is based on the basic assumption that the memory and controller are using the same power domain as both are digital. This creates an issue for precision converters as precision converters require at least 2 or more power domains (e.g., analog and digital). This is a major concern in terms of communication robustness, for if a power domain temporarily shuts down, the precision converter will be reset. In case of failure in the digital domain, shutdown is not a major problem as both devices (master and slave) are reset. Also, as the transmission mode is defined based on the command and address transmitted at the beginning of the frame, communication issues due to differing transmission modes are avoided.

However, in precision converters this is different as precision converters require different supply domains and the failure in one of them could reset the precision converter but not the controller. In the case of analog domain failure, the converter will be reset to return to the default SPI communication mode. This is problematic, for there is not a command phase in Multi-I/O SPI to minimize the preamble. As a result, the controller cannot indicate at the beginning of the communication how many data lines will be used for the data in accordance with the JEDEC standard. Thus, if the converter is reset, it is possible that the controller will write in one mode and the converter will read in a different mode.

Figure 7:
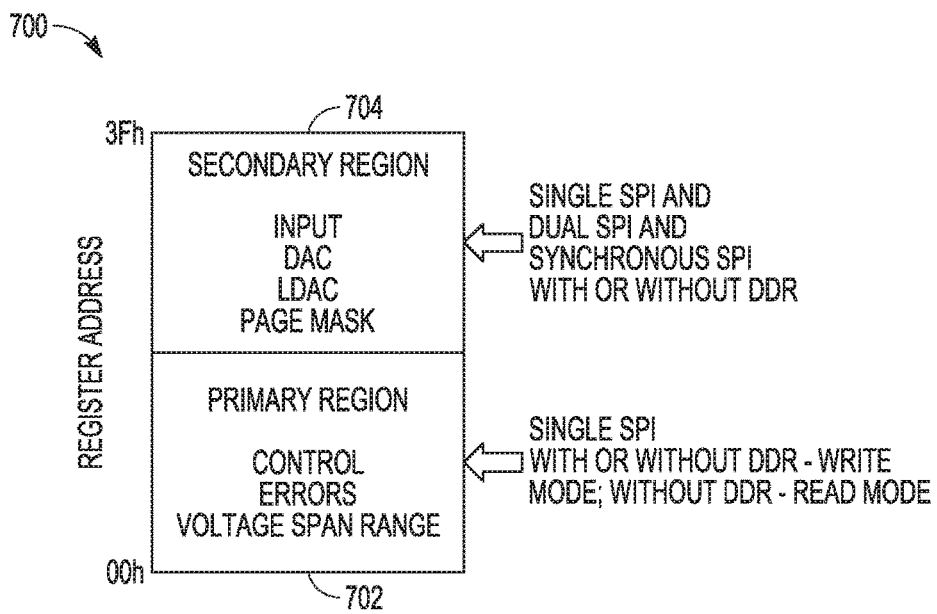
FIG. 7 illustrates a sample embodiment in which the registers of the controller are divided into a primary region and a secondary region for managing a precision converter.
Figure 8:
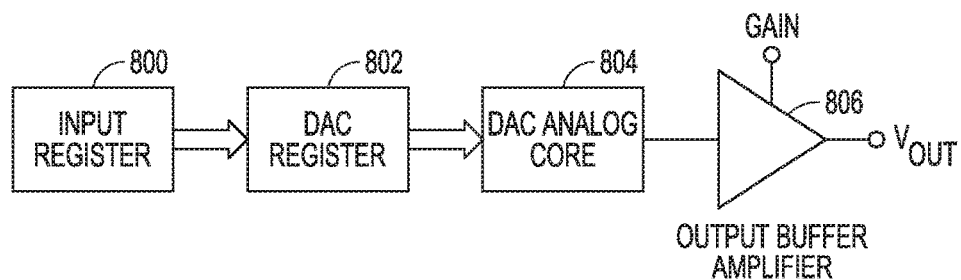
FIG. 8 illustrates a sample DAC of the type implemented by the registers of the secondary region in the embodiment of FIG. 7.

To solve this problem, the register access may be divided into two regions. For example, as illustrated in FIG. 7, the registers 700 are divided into a primary region 702 that contains the register supporting interface configuration, errors, power modes, and any other information for configuring the device, for describing device behaviour, and providing error checks and status, including data identifying the voltage span range, and a secondary region 704 that contains the registers that control the input data, DAC and load DAC (LDAC) output that sets the physical output voltage, ADC conversion, a page mask, and the like. In general, the primary region 702 and the secondary region 704 are defined as follows:

1. Primary—This region includes a register to configure the device, including information about errors; and
2. Secondary—This region includes the registers that are needed for basic converter operation (e.g., in ADC the ones that provide information about conversions and in DAC the one that defines the output voltage or current) and in general any associate register for these functions, as in the case of input registers 800 (FIG. 8) of a DAC comprising DAC register 802 and DAC analog core 804 and output buffer amplifier 806 controlled by the input and DAC register 802 in a sample embodiment.

In sample embodiments, the primary region 702 is accessed only in default mode at power-up for write and/or read operations. On the other hand, the secondary region 704 is accessed by any mode enabled in accordance with the configuration registers of the primary region 702. Thus, the default mode is entered at power-up and the input, DAC, and LDAC functions are unaffected. In the sample embodiments, the default power-up can be changed by adding an external pin to the slave 400 to provide a mode select function that defines the interface mode at power-up. The default mode may also be defined by internal fuses or registers or overwritten if an external pin(s) is/are dedicated for such purposes.

Figure 9A:
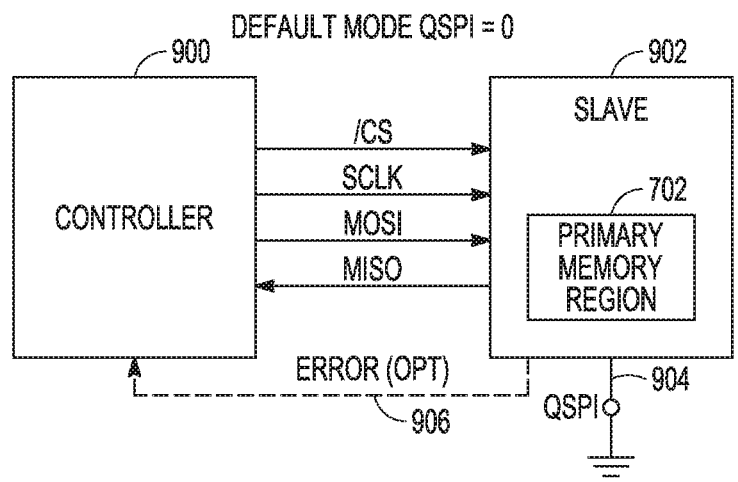
FIG. 9A illustrates a sample embodiment of a controller and a slave set in a first default mode where an external Quad SPI (QSPI) pin is grounded (=0) to disable.
Figure 9B:
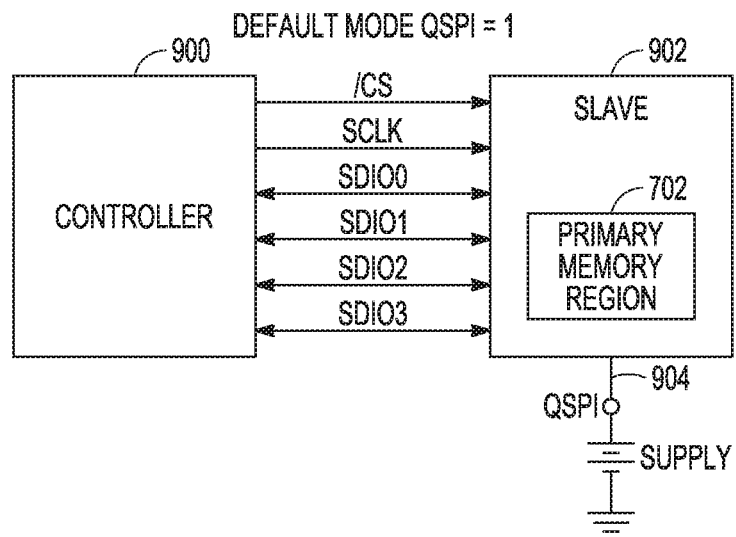
FIG. 9B illustrates a second default mode where the controller reconfigures the SPI in Quad SPI mode to access the primary memory region when the external QSPI pin is connected to the power supply (=1) to enable.

For example, FIG. 9A and FIG. 9B illustrate the controller 900 and slave 902 in respective default power-up modes. In FIG. 9A, the controller 900 and slave 902 are set in a first default mode where the external Quad SPI (QSPI) pin 904 is grounded (=0) to disable. In this case, the slave 902 is configured for SPI in the first default mode, which assumes classic SPI as the default power-up mode for accessing the primary memory region 702. In the first default mode, the slave triggers the error pin 906 after the device has been initialized, which means that every time the device recovers from a reset that is intentional or not, the error pin 906 highlights the initialization. In such case, the error registers are pulled that are placed in the primary memory region 702. The error registers can be pulled routinely or triggered by the optional error or alarm pin 906 as represented in FIG. 9A.

As an example, when the alert/alarm pin 906 triggers, the controller 900 reconfigures the Multi-I/O SPI interface to a basic converter mode, reads the error register, reconfigures some registers if appropriate, and returns to secondary region communication. In such an example, almost all possible transfer modes will have a common feature, namely, that the first byte/s will be transferred using a single data line so that the converter can identify which mode should be enabled based on the first byte/s. In the JEDEC standard, the command phase (in this case the address phase, as the command and address are merged into a single byte) is always transferred using one data line.

On the other hand, FIG. 9B shows a second default mode where the controller 900 reconfigures the SPI in Quad SPI mode to access the primary memory region 702 and secondary memory region 704 when the external QSPI pin 904 is connected to the power supply (=1) to enable.

The JEDEC standard further defines a special command for placing the Multi-I/O into a "full" dual, quad, or octal SPI mode where all the different phases are transferred using 2, 4, or 8 data lines, respectively. In the example illustrated in FIG. 9A the full mode is not supported by the register. Instead, the full mode can only be enabled by a dedicated hardware pin, like QSPI pin 904.

On the other hand, if a superset communication is needed that, for example, uses 4 data lines for every single communication byte, in memory this operation mode is enabled by hardware. To enable a full mode and change the default mode at power-up, the dedicated QSPI pin 904 is set to high to enable the faster (full mode) interface and to define this mode as the default at power-up, as illustrated in FIG. 9B. When the QSPI pin 904 is tied high, the default mode changes to Quad SPI and the address is transferred using the 4 data lines, rather than 1, as illustrated in FIG. 9B.

Thus, in this embodiment, separate register regions are created whereby only one region (primary region) may be accessed in default mode at power-up for write and/or read operations, thereby preventing the controller and the converter from starting up in different modes in the event of a power failure.

In addition to creating the power-up mode as described herein, there are other ways to prevent the controller and the converter from starting up in different modes after a power failure. However, the other approaches are less optimal and/or are less efficient. For example, the Multi-I/O SPI may seize a bit on the first byte transferred to the converter to indicate the data lines used to transfer the data phase. This approach limits the maximum register size to 64 locations, which is a major limitation. Also, a second byte may be added that acts as a command phase byte. In such a case, an extra byte is sent in every single communication impacting the interface's efficiency. On the other hand, the CRC may be enabled, again causing more byte/s to be transferred. An algorithm may also be implemented to detect the converter operation mode. However, this detection may add complexity to the system algorithm and requires time, which may require user customization.

EXAMPLES

Certain embodiments are described herein as numbered examples 1, 2, 3, etc. These numbered examples are provided as examples only and do not limit the subject technology.

Example 1 is a Multi-I/O serial peripheral interface (SPI)), comprising a controller having registers divided into a primary region and a secondary region, the primary region including data for configuring the controller and data about errors, and the secondary region including data for providing at least one of a digital to analog converter (DAC) operation or an analog to digital converter (ADC) operation; a slave device that transfers data to/from the controller via respective data lines; and a mode selector adapted to select a default mode at power-up wherein the primary region is accessed in the default mode only for write and/or read operations and the secondary region is accessed by any mode enabled by the primary region.

Example 2 is an interface as in Example 1, wherein the primary region contains at least one register that stores at least one of data supporting interface configuration, data supporting errors, data supporting power modes, data for configuring the controller, data describing controller behaviour, or data for providing error checks and status.

Example 3 is an interface as in Examples 1-2, wherein the primary region contains data identifying a voltage span range of the DAC operation or the ADC operation.

Example 4 is an interface as in Examples 1-3, wherein the secondary region contains at least one register that controls the input data and at least one of the DAC operation or the ADC operation.

Example 5 is an interface as in Examples 1-4, wherein the secondary region contains a page mask.

Example 6 is an interface as in Examples 1-5, wherein the slave device comprises at least one internal fuse or at least one switch adapted to provide a power-up mode select function that defines an interface mode at power-up of the slave device.

Example 7 is an interface as in Examples 1-6, wherein the mode selector comprises a mode selection pin on the slave device that is adapted to provide a power-up mode select function that defines an interface mode at power-up of the slave device.

Example 8 is an interface as in Examples 1-7, wherein the mode selection pin on the slave device is connected to a first voltage to set the controller and slave device in a first default mode at power up in which the SPI is configured for accessing only the primary region.

Example 9 is an interface as in Examples 1-8, further comprising an error pin connecting the slave device to the controller, wherein the primary region comprises error registers, and wherein in the first default mode, the slave device triggers the error pin and pulls the error registers after the slave device has been initialized.

Example 10 is an interface as in Examples 1-9, wherein the mode selection pin on the slave device is connected to a second voltage to set the controller and slave device in a second default mode at power up in which the controller reconfigures the SPI in a dual, quad, or octal SPI mode to access the primary region and the secondary region using two, four, or eight data lines, respectively.

Example 11 is an interface as in Examples 1-10, wherein the controller has at least two SPI blocks having internally synchronized clock signals, each SPI block transferring data simultaneously, wherein the slave device transfers data to/from each SPI block of the controller via the respective data lines.

Example 12 is an interface as in Examples 1-11, wherein the mode selector is further adapted to select a first mode for transferring data between the slave device and each SPI block of the controller in a bits scrambling format dictated by a memory transfer standard or a second mode for transferring data between the slave device and each SPI block of the controller without the bits scrambling format dictated by the memory transfer standard.

Example 13 is an interface as in Examples 1-12, wherein the memory transfer standard comprises a JEDEC flash memory communication standard.

Example 14 is a method for powering up a Multi-I/O serial peripheral interface (SPI)), comprising providing a controller having registers divided into a primary region and a secondary region, the primary region including data for configuring the controller and data about errors, and the secondary region including data for providing at least one of a digital to analog converter (DAC) operation or an analog to digital converter (ADC) operation; and selecting a default mode at power-up in which the primary region is accessed in the default mode only for write and/or read operations and the secondary region is accessed by any mode enabled by the primary region.

Example 15 is a method as in Example 14, further comprising storing in at least one register of the primary region at least one of data supporting interface configuration, data supporting errors, data supporting power modes, data for configuring the controller, data describing controller behaviour, or data for 5 providing error checks and status.

Example 16 is a method as in Examples 14-15, further comprising storing in the primary region data identifying a voltage span range of the DAC operation or the ADC operation.

Example 17 is a method as in Examples 14-16, further comprising setting a mode selection pin on a slave device that that transfers data to/from the controller via respective data lines, the mode selection pin providing a power-up mode select function that defines an interface mode at power-up of the slave device.

Example 18 is a method as in Examples 14-17, further comprising connecting the mode selection pin on the slave device to a first voltage to set the controller and slave device in a first default mode at power up in which the SPI is configured for accessing only the primary region.

Example 19 is a method as in Examples 14-18, further comprising the slave device triggering, in the first default mode, an error pin connecting the slave device to the controller, the error pin pulling error registers of the primary region after the slave device has been initialized.

Example 20 is a method as in Examples 14-19, further comprising connecting the mode selection pin on the slave device to a second voltage to set the controller and slave device in a second default mode at power up in which the controller reconfigures the SPI in a dual, quad, or octal SPI mode to access the primary region and the secondary region using two, four, or eight data lines, respectively.

Example 21 is a Multi-I/O serial peripheral interface (SPI)), comprising a controller having at least two SPI blocks having internally synchronized clock signals, each SPI block transferring data simultaneously; a slave device that transfers data to/from each SPI block of the controller via respective data lines; and a mode selector adapted to select a first mode for transferring data between the slave device and each SPI block of the controller in a bits scrambling format dictated by a memory transfer standard or a second mode for transferring data between the slave device and each SPI block of the controller without the bits scrambling format dictated by the memory transfer standard whereby each data line is associated with a data channel.

Example 22 is an interface as in Example 21, wherein the memory transfer standard comprises a JEDEC flash memory communication standard.

Example 23 is an interface as in Examples 21-22, wherein the mode selector selects the first mode and each data line is adapted for bidirectional communication to the data channel when more than one data line is enabled to read and/or write data to the slave device from the controller.

Example 24 is an interface as in Examples 21-23, further comprising at least one bidirectional multiplexer situated in the respective data lines, wherein the mode selector comprises a pin that provides a mode selection signal to the at least one bi-directional multiplexer.

Example 25 is an interface as in Examples 21-24, further comprising a data select pin on the slave device that provides a mode selection signal to the respective data lines.

Example 26 is an interface as in Examples 21-25, wherein the mode selector selects the second mode when a device being communicated with via the Multi-I/O SPI is not a JEDEC standard device by changing a state of the data select pin on the slave device.

Example 27 is a method for controlling a Multi-I/O serial peripheral interface (SPI)), comprising providing a controller having at least two SPI blocks having internally synchronized clock signals; each SPI block transferring data simultaneously; and selecting a first mode or a second mode for transferring data between the controller and a slave device that transfers data to/from each SPI block of the controller via respective data lines, wherein data is transferred in the first mode by each SPI block of the controller in a bits scrambling format dictated by a memory transfer standard and is transferred in the second mode by each SPI block of the controller without the bits scrambling format dictated by the memory transfer standard whereby each data line is associated with a data channel.

Example 28 is a method as in Example 27, wherein the memory transfer standard comprises a JEDEC flash memory communication standard.

Example 29 is a method as in Examples 27-28, wherein when the first mode has been selected, each data line providing bidirectional communication to the data channel when more than one data line is enabled to read and/or write data to the slave device from the controller.

Example 30 is a method as in Examples 27-29, wherein selecting the first mode or the second mode for transferring data between the controller and the slave device comprises providing a mode selection signal to at least one bidirectional multiplexer situated in the respective data lines.

Example 31 is a method as in Examples 27-30, wherein providing the mode selection signal comprises changing a state of a data select pin of the slave device.

Example 32 is a method as in Examples 27-31, wherein selecting the first mode or the second mode for transferring data between the controller and the slave device comprises selecting the second mode when a device being communicated with via the Multi-I/O SPI is not a JEDEC standard device by changing a state of the data select pin on the slave device.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A Multi-I/O serial peripheral interface (SPI), comprising:
   a controller having registers divided into a primary region and a secondary region, the primary region including data for configuring the controller and data about errors, and the secondary region including data for providing at least one of a digital to analog converter (DAC) operation or an analog to digital converter (ADC) operation;
   a slave device that transfers data to/from the controller via respective data lines; and
   a mode selector adapted to select a default mode at power-up wherein the primary region is accessed in the default mode only for write and/or read operations and the secondary region is accessed by any mode enabled by the primary region, wherein the mode selector is adapted to select at least one mode for transferring data dictated by a Joint Electron Device Engineering Council (JEDEC) flash memory communication standard.

2. The interface of claim 1, wherein the primary region contains at least one register that stores at least one of data supporting interface configuration, data supporting errors, data supporting power modes, data for configuring the controller, data describing controller behavior, or data for providing error checks and status.

3. The interface of claim 1, wherein the primary region contains data identifying a voltage span range of the DAC operation or the ADC operation.

4. The interface of claim 1, wherein the secondary region contains at least one register that controls input data and at least one of the DAC operation or the ADC operation.

5. The interface of claim 4, wherein the secondary region contains a page mask.

6. The interface of claim 1, wherein the slave device comprises at least one internal fuse or at least one switch adapted to provide a power-up mode select function that defines an interface mode at power-up of the slave device.

7. The interface of claim 1, wherein the mode selector comprises a mode selection pin on the slave device that is adapted to provide a power-up mode select function that defines an interface mode at power-up of the slave device.

8. The interface of claim 7, wherein the mode selection pin on the slave device is connected to a first voltage to set the controller and slave device in a first default mode at power up in which the SPI is configured for accessing only the primary region.

9. The interface of claim 8, further comprising an error pin connecting the slave device to the controller, wherein the primary region comprises error registers, and wherein in the first default mode, the slave device triggers the error pin and pulls the error registers after the slave device has been initialized.

10. The interface of claim 7, wherein the mode selection pin on the slave device is connected to a second voltage to set the controller and slave device in a second default mode at power up in which the controller reconfigures the SPI in a dual, quad, or octal SPI mode to access the primary region and the secondary region using two, four, or eight data lines, respectively.

11. The interface of claim 1, wherein the controller has at least two SPI blocks having internally synchronized clock signals, each SPI block transferring data simultaneously, wherein the slave device transfers data to/from each SPI block of the controller via the respective data lines.

12. The interface of claim 11, wherein the at least one mode includes a first mode and a second mode, wherein the mode selector is further adapted to select the first mode for transferring data between the slave device and each SPI block of the controller in a bits scrambling format dictated by the memory transfer standard or the second mode for transferring data between the slave device and each SPI block of the controller without the bits scrambling format dictated by the memory transfer standard.

13. A method for powering up a Multi-I/O serial peripheral interface (SPI), comprising:
  providing a controller having registers divided into a primary region and a secondary region, the primary region including data for configuring the controller and data about errors, and the secondary region including data for providing at least one of a digital to analog converter (DAC) operation or an analog to digital converter (ADC) operation; and
  selecting a default mode at power-up in which the primary region is accessed in the default mode only for write and/or read operations and the secondary region is accessed by any mode enabled by the primary region; and
  selecting at least one mode for transferring data dictated by a Joint Electron Device Engineering Council (JEDEC) flash memory communication standard.

14. The method of claim 13, further comprising storing in at least one register of the primary region at least one of data supporting interface configuration, data supporting errors, data supporting power modes, data for configuring the controller, data describing controller behavior, or data for providing error checks and status.

15. The method of claim 14, further comprising storing in the primary region data identifying a voltage span range of the DAC operation or the ADC operation.

16. The method of claim 13, further comprising setting a mode selection pin on a slave device that that transfers data to/from the controller via respective data lines, the mode selection pin providing a power-up mode select function that defines an interface mode at power-up of the slave device.

17. The method of claim 16, further comprising connecting the mode selection pin on the slave device to a first voltage to set the controller and slave device in a first default mode at power up in which the SPI is configured for accessing only the primary region.

18. The method of claim 17, further comprising the slave device triggering, in the first default mode, an error pin connecting the slave device to the controller, the error pin pulling error registers of the primary region after the slave device has been initialized.

19. The method of claim 16, further comprising connecting the mode selection pin on the slave device to a second voltage to set the controller and slave device in a second default mode at power up in which the controller reconfigures the SPI in a dual, quad, or octal SPI mode to access the primary region and the secondary region using two, four, or eight data lines, respectively.

20. A Multi-I/O serial peripheral interface (SPI), comprising:
  a controller having registers divided into a primary region and a secondary region, the primary region including data for configuring the controller and data about errors, and the secondary region including data for providing at least one of a digital to analog converter (DAC) operation or an analog to digital converter (ADC) operation, wherein the secondary region contains at least one register that controls input data and at least one of the DAC operation or the ADC operation, and wherein the secondary region contains a page mask;
  a slave device that transfers data to/from the controller via respective data lines; and
  a mode selector adapted to select a default mode at power-up wherein the primary region is accessed in the default mode only for write and/or read operations and the secondary region is accessed by any mode enabled by the primary region.

21. The interface of claim 20, wherein the primary region contains data identifying a voltage span range of the DAC operation or the ADC operation.

* * * * *